US009291656B2

(12) United States Patent
Green

(10) Patent No.: US 9,291,656 B2
(45) Date of Patent: Mar. 22, 2016

(54) DEVICE FOR CALIBRATING AND VERIFYING THE INTEGRITY OF RESISTIVITY-BASED SENSING PROBES

(71) Applicant: Merck Sharp & Dohme Corp., Rahway, NJ (US)

(72) Inventor: Ralph Green, Bronx, NY (US)

(73) Assignee: Merck Sharp & Dohme Corp., Rahway, NJ (US)

( * ) Notice: Subject to any disclaimer, the term of this patent is extended or adjusted under 35 U.S.C. 154(b) by 156 days.

(21) Appl. No.: 14/178,464

(22) Filed: Feb. 12, 2014

(65) Prior Publication Data

US 2014/0225627 A1    Aug. 14, 2014

Related U.S. Application Data

(60) Provisional application No. 61/764,192, filed on Feb. 13, 2013.

(51) Int. Cl.
  *G01R 27/22* (2006.01)
  *G01R 35/00* (2006.01)

(52) U.S. Cl.
  CPC .............. *G01R 27/22* (2013.01); *G01R 35/005* (2013.01)

(58) Field of Classification Search
  CPC .................................................... G01R 35/005
  See application file for complete search history.

(56) References Cited

U.S. PATENT DOCUMENTS

| | | | | |
|---|---|---|---|---|
| 3,783,375 A | * | 1/1974 | Bennett | G01R 27/14 324/601 |
| 4,061,198 A | * | 12/1977 | Caldicott | G01G 23/16 177/165 |
| 6,870,359 B1 | * | 3/2005 | Sekel | G01R 35/005 324/73.1 |
| 2012/0068692 A1 | * | 3/2012 | Patel | G01R 15/207 324/202 |

OTHER PUBLICATIONS

Mettler Toledo Thornton, "Process Analytics Catalog", Oct. 2011.
Extech Instruments, "Multimaster Series Precision Multimeters" Brochure, 2009.

* cited by examiner

*Primary Examiner* — Tung X Nguyen
*Assistant Examiner* — Feba Pothen
(74) *Attorney, Agent, or Firm* — Law Office of Grady L. White, LLC

(57) ABSTRACT

A calibration device for sensing probes includes a housing; a test resistor within the housing; and probe holder by means of which the sensing probe's electrodes can be brought into electrical contact with the test resistor. The test resistor provides a known or a knowable test resistance between the sensing probe's electrodes. In an embodiment having a variable-resistance test resistor, the device includes an access point at which resistance across the test resistor can be measured using an ohm meter. Furthermore, the device includes one or more access points at which resistance, as measured by the sensing probe, can be measured using an ohm meter; using a monitoring device to which the sensing probe ordinarily is connected when in use; or, in some cases, using either.

17 Claims, 8 Drawing Sheets

DEVICE FOR CALIBRATING AND VERIFYING THE INTEGRITY OF RESISTIVITY-BASED SENSING PROBES

CROSS-REFERENCE TO RELATED APPLICATION

This application claims the priority benefit of U.S. provisional application No. 61/764,192, filed on Feb. 13, 2013, the entire contents of which are incorporated herein by reference.

FIELD OF THE INVENTION

In general, the invention relates to calibration and verification of the integrity of sensing devices. More particularly, the invention relates to calibration and verification of the integrity of sensing probes that measure the purity of a liquid medium by measuring the resistivity or conductivity of the liquid medium.

BACKGROUND OF THE INVENTION

In general, the degree of purity of various liquid media can be determined by measuring the conductivity or resistivity of a given liquid medium, since the resistivity or conductivity of the liquid medium typically varies in some known relationship with the level of impurities (e.g., total dissolved solids) that are present in the liquid medium. For example, the resistivity of ultrapure water at 25° C. is taken to be 18.18 MΩ-cm. As the concentration of various ions in the water increases, the ability of the water to conduct an electrical current increases and the resistivity decreases from that value. Conversely expressed, the conductivity of water—which is the inverse of its resistivity—will increase from a value of 5.5 μS/m. Thus, it is common to measure resistivity, and hence purity, of a liquid medium such as water by disposing a pair of spaced-apart electrodes into the liquid medium such that the medium fills the gap between the electrodes and measuring electrical resistance or conductivity between the electrodes as provided by the liquid medium.

In various industrial processes, the purity of a given process stream (e.g., a supply of ultrapure water for use in manufacturing pharmaceuticals, semiconductor devices, etc.) may be measured on a continuous basis, and a sensing probe 10, such as a "SMART SENSOR" sensing probe, available from Mettler-Toledo Ingold Inc. (Thornton) in Bedford, Mass., and shown in FIG. 1, can be used to do so. The sensing probe 10 includes a sensing head 12; a conductor cable 14 extending from the sensing head 12; and an output connector 16 located at an opposite end of the conductor cable 14. The sensing head 12 includes, among other sensing components, a pair of electrodes that are spaced apart from each other. For example, the SMART SENSOR sensing probe 10 shown in FIG. 1 has a longitudinally extending, central positive electrode, not shown, which is surrounded by a longitudinally extending negative shell electrode 18 in coaxial relation to the central electrode. A threaded collar 20 at the base of the sensing head 12 allows the sensing head 12 to be screwed into a probe gland that is attached to a conduit that conveys a given process stream liquid, with the central and shell electrodes extending into the process stream liquid. Additionally, a sensing probe 10, such as the SMART SENSOR sensing probe, may also include a temperature sensor to measure the local temperature of the liquid medium into which the sensing probe extends, as well as sensors to measure other parameters associated with the process stream (e.g., flow rate, ORP (oxidation reduction potential), etc.) on a continuous basis. Furthermore, the output connector 16 of the sensing probe 10 is connected to a monitoring instrument, not illustrated, such as a 770PC multiparameter instrument/transmitter, also available from Mettler-Toledo Ingold Inc. (Thornton) in Bedford, Mass. The monitoring instrument "reads" the signals from the sensing probe 10 and displays them to an operator as parameter values and/or otherwise provides the signals and/or the corresponding parameter values to a process control center.

Further still, a sensing probe 10 used to measure liquid purity by means of resistivity/conductivity has a cell constant associated with it. The cell constant, which varies with the geometry of the sensor electrodes, expresses the relationship (i.e., a ratio) between resistivity as measured by a given sensing probe 10 and the actual resistivity of the liquid medium. Therefore, in order to convert measured resistivity into actual resistivity—and hence purity—of the sampled liquid, it is necessary to know the cell constant of a given sensing probe 10. A SMART SENSOR sensing probe has an electrically-erasable programmable read-only memory (EEPROM) in which the associated cell constant is stored. The cell constant is transmitted automatically to a 770PC multiparameter instrument/transmitter when the sensing probe is connected to the process controller.

Over time, however, a sensing probe 10 can "go bad" and no longer provide accurate sensing results. For example, if the geometry of the electrodes varies for some reason such as thermal expansion and contraction without the electrodes returning to their original configuration, then the cell constant will "drift." If that geometric variation is nominal, then the sensing probe can be recalibrated, i.e., its cell constant can be determined anew (and in the case of a SMART SENSOR sensing probe, reprogrammed into the EEPROM). On the other hand, if the geometry of the electrodes varies by an excessive amount such that the cell constant changes by an amount greater than ±1 percent, then the sensing probe will be unusable and should be discarded.

Conventionally, it is known to use a calibration test solution of fixed, known concentration/degree of purity to calibrate a sensing probe. But, if the degree of purity of the calibration solution is not known, it may be possible to ascertain the sensing probe's cell constant by varying the temperature of the calibration solution and monitoring how the measured resistivity changes. This is because resistivity varies with temperature and concentration/purity of the calibration solution will "drop out of the analysis" (because it is held constant from calibration test point to calibration test point). Because calibration test solutions can be contaminated easily, however, it is possible that the concentration/purity of the test solution is not what it is believed to be. Alternatively, even if a protocol that does not require knowledge of the test solution's concentration/purity is used, such a protocol is generally more complex than one using a calibration test solution in which the concentration/purity of the test solution is (putatively) known, and therefore is subject to its own types of errors.

Accordingly, there is a need in the art for a device and methodology for calibrating and/or verifying the integrity of resistivity-based sensing probes that is less complex and/or more reliable than such prior art calibration methodologies.

SUMMARY OF THE INVENTION

A calibration device for calibrating and/or verifying the integrity of resistivity-based sensing probes according to the invention, and corresponding methodologies, meets that need. Thus, in one aspect, the invention features a calibration device. The calibration device includes a housing and a test resistor located inside of the housing, and the test resistor has a known, predetermined resistance value or a variable resistance value that can be measured from the outside of the housing. At least one probe holder is attached to the housing, and the probe holder is constructed to facilitate bringing the sensing probe's electrodes into electrical contact with the test resistor so that the test resistor provides a known or knowable test resistance between the sensing probe's electrodes.

In one disclosed embodiment of the device, the test resistor is a variable-resistance device, and the calibration device has a probe-input access point at which resistance across the test resistor can be measured, e.g., using an ohm meter. Additionally in that one disclosed embodiment, the calibration device has a probe-output port to which an output portion of the sensing probe is connected and a probe-output access point at which resistance across the test resistor, as measured by the sensing probe, can be measured, e.g., using an ohm meter.

In another aspect, the invention features a method for calibrating or verifying the integrity of a conductivity/resistance-based sensing probe. The method includes applying a known or a knowable test resistance across the sensing probe's electrodes and comparing an output signal from the sensing probe to the test resistance. If the output signal indicates a resistance that is equal to the test resistance, the sensing device is good. However, if the output signal indicates a resistance that varies from the test resistance by an amount that is within an acceptable limit, then the cell constant is modified to bring the resistance indicated by the signal output into agreement with the test resistance. If the output signal indicates a resistance that varies from the test resistance by an amount that exceeds the acceptable limit, then the sensing device is deemed to be no good, indicating that the sensing device ought to be discarded.

In one disclosed embodiment of the method, the test resistance is provided by a variable-resistance device. In that case, the test resistance is measured by using, for example, an ohm meter. Additionally, the test resistance can be varied among several values and the output signal compared to the test resistance at each of those values to assess the linearity of the sensing probe's sensing response.

BRIEF DESCRIPTION OF THE DRAWINGS

The invention will now be described in greater detail in connection with the drawings, in which.

DETAILED DESCRIPTION

Figure 1:
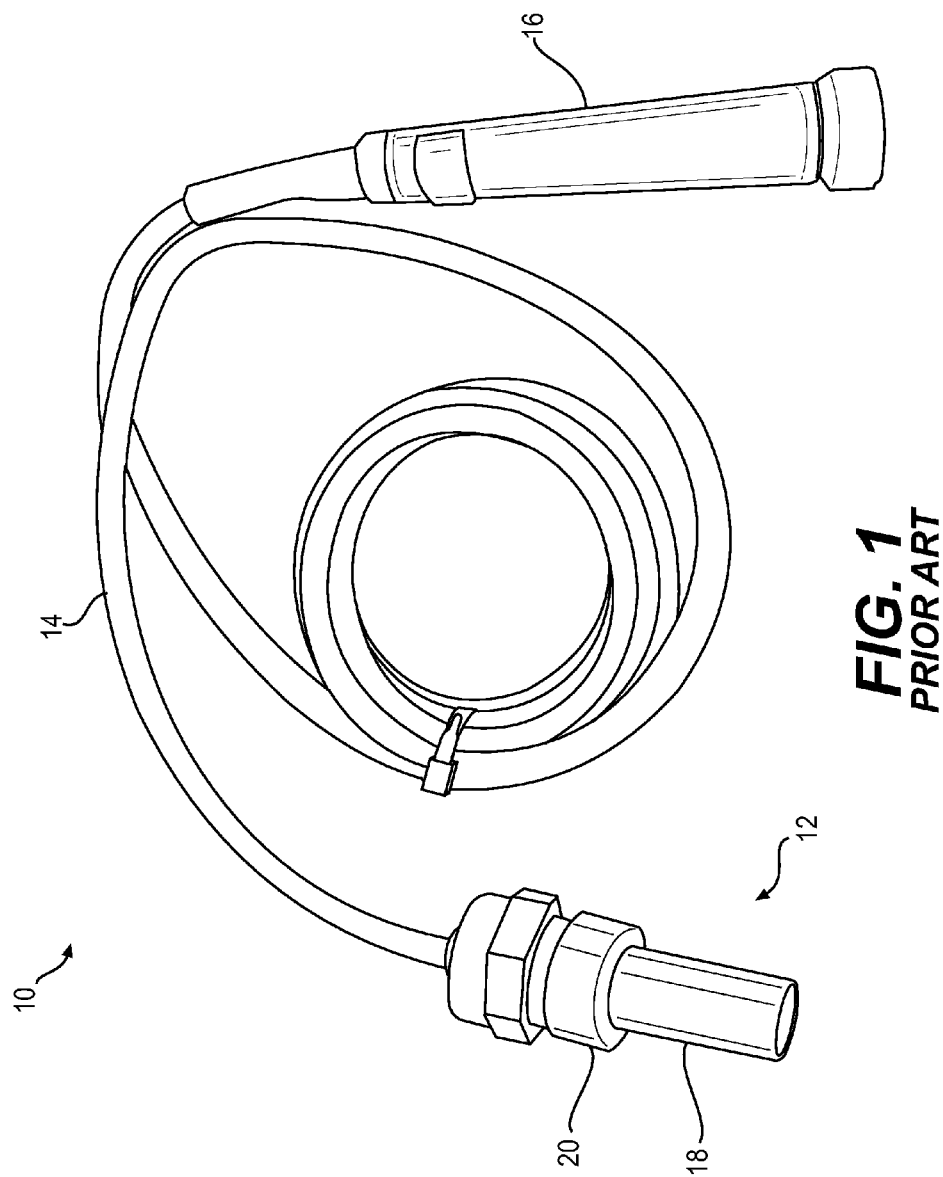
FIG. 1 illustrates a resistance/conductivity-based sensing probe of the sort that a calibration device according to the invention is used to calibrate and/or the integrity of which the calibration device is used to verify.

One exemplary embodiment 100 of a calibration device according to the invention is illustrated in FIGS. 2-8. In general, the calibration device 100 includes a housing 102; at least one probe holder mounted to a top wall of the housing 102 (e.g., two probe holders 104a and 104b as shown in the exemplary embodiment 100); a probe-output port 106 (which is optional, as explained below) mounted to the same wall of the housing 102 as the probe holder(s) for convenient use of the device 100; a probe-input access point 108 located on a front wall of the housing 102; a first, primary probe-output access point 110 also located on a front wall of the housing 102; and a second, secondary probe-output access point 112 located on a side wall of the housing. (Optionally, just one probe-output access point 110 or 112 may be provided; or, in a very rudimentary embodiment, no probe-output port or probe-output access point need be provided at all, as explained further below.) Providing multiple probe holders of different sizes and/or configurations allows different sizes/models of sensing probes to be calibrated or verified using a calibration device as per the invention.

Additionally, the illustrated embodiment 100 includes a test resistor 114 (addressed in greater detail below) that includes several variable-resistance resistors (e.g., potentiometers) 116a, 116b, and 116c, which are mounted to the front wall of the housing 102 with their resistance-setting knobs or dials extending outside of the housing so as to be readily accessible to a user. Further still, in terms of the general arrangement of components, the illustrated embodiment 100 includes a multi-position function switch 118 and a multi-position range switch 120 that are each accessible on the front wall of the housing 102. These switches 118 and 120 will be explained in greater detail below.

Finally, in terms of the general arrangement of components, the illustrated embodiment 100 includes a temperature sensor 122 that is located inside of the housing 102 so as to measure ambient temperature inside the housing. In the illustrated embodiment 100, the temperature sensor 122 is an RTD (resistance temperature detector), which operates based on the principle that electrical resistance of a material—a platinum probe 123 in this case—may vary with temperature. Accordingly, in the illustrated embodiment 100, a fourth access point 124 is provided on the front wall of the housing 102 to permit resistance across the temperature sensor 122 to be measured, e.g. using an ohm meter, and, hence, temperature inside the housing to be determined.

With respect to the housing 102, it can have any configuration that is convenient. In the illustrated embodiment 100, for example, the housing is constructed using a PELICAN box having a container portion 126 and a lid 128 that is attached to the container portion 126 by means of a hinge 130, with a pair of latches 132 that hold the lid 128 against the container portion 126 to close the housing 102. As illustrated in FIGS. 3, 4, 5, and 8, the top wall of the housing to which the probe holders 104a and 104b and the probe-output port 106 are mounted is provided by a sidewall of the container portion 126. A secondary probe-output access point 112 is mounted to another sidewall of the container portion 126. Mounted on the inside of the lid 28 of the housing are variable-resistance resistors 116a, 116b, 116c; the function switch 118; the range switch 120; the probe-input access point 108; the primary probe-output access point 110; and the fourth access point 124 (for measuring resistance across the RTD temperature sensor 122). Suitably, the temperature sensor 122 is mounted inside the container portion 126 of the PELICAN box, along with a pair of terminal strips 134, 136 (illustrated in FIG. 6 and, in particular, FIG. 7), which facilitate making various electrical connections and provide for alternate circuit pathways.

Preferably, the housing 102 is fabricated from a non-electrically conducting material such as polypropylene (from which PELICAN boxes often are made) or other thermoplastic or thermosetting material. This helps prevent short-circuiting among the various components of the calibration device 100. Furthermore, the housing 102 is sealed to isolate the environment inside of it, thereby helping to ensure the accuracy of the measurements provided by the temperature sensor 122. (Gasket 138 provided around the periphery of the lid 128 serves to seal the housing 102.)

On a fundamental level, a calibration device according to the invention serves to place a known or knowable test resistance across the electrodes of a resistivity/conductivity-based sensing probe, such that the output of the sensing probe—i.e., the resistance as measured by the sensing probe—can be cross-checked against the input; a test resistor provides that known or knowable test resistance. In one embodiment (not illustrated), the test resistor—which could consist of one or more resistors in combination depending on the desired resistance of the test resistor—may have a fixed, predetermined resistance that is known or indicated (e.g., in a user manual) to the operator of the calibration device. In that case, it would not be necessary for the calibration device to include a probe-input access point such as the probe-input access point 108 (which permits the resistance being placed across the electrodes of the sensing probe to be measured directly), although providing such a probe-input access point would allow the user to verify or double-check the resistance that is placed across the sensing probe electrodes. It would, however, be particularly advantageous in such a fixed-resistance embodiment—particularly if a probe-input access point were not, in fact, provided—to provide a temperature sensor to measure temperature inside the housing. This is because resistance of the test resistor likely would vary with temperature inside the housing and such variation should be taken into account when cross-checking the output of the sensing probe (i.e., the resistance of the test resistor as measured by the sensing probe) against the input to the sensing probe (i.e., the actual resistance of the test resistor).

On the other hand, in the illustrated embodiment 100 of a calibration device according to the invention, the test resistor 114 is composed of one or, as shown, several resistors 116a, 116b, and 116c arranged in series, which resistors are all variable-resistance resistors. By changing the overall resistance of the test resistor 114 by varying the setting of one or more of the resistors 116a, 116b, and/or 116c, the linearity of a given probe's response to varying input resistances can be verified. Suitably, variable resistors 116a and 116c are ten-turn, locking potentiometers (i.e., ten turns between minimum resistance of 0 Ω and the device's maximum resistance, with the ability to lock the device at a given setting), while variable resistor 116b is a one-turn, non-locking potentiometer (i.e., one turn between minimum resistance of 0 Ω and the device's maximum resistance). The one-turn potentiometer 116b provides for coarse adjustments in resistance value of the test resister 114; the ten-turn potentiometers 116a and 116c, on the other hand, provide for fine adjustments in resistance value of the test resister 114.

Additionally, the test resistor 114 in the illustrated embodiment 100 includes an offset or bias resistor 116d (FIGS. 6 and 7), the resistance of which is fixed (barring temperature fluctuation inside the housing 102). The offset resistor can consist of several resistors arranged in series with each other or, as shown in the illustrated embodiment 100, the offset resistor can consist of a single resistor 116d.

Furthermore, the offset resistor can be fixed in series with the variable resistors 116a-116c or, as shown in the illustrated embodiment 100, the offset resistor 116d can selectively be placed in series with the variable resistors 116a-116c by means of range switch 120. Thus, when range switch 120 is in Position 2 as illustrated, conductor 140—with the offset resistor 116d connected to it—will form part of the active current/resistance pathway into contact with which the electrodes of the sensing probe will be placed, and all four resistors 116a-116d will, in series, form the test resistor 114. On the other hand, when range switch 120 is in Position 3 as illustrated, conductor 142 will be switched into the active current/resistance pathway such that current bypasses conductor 140, and conductor 140 will be removed from the active current/resistance pathway. Thus, when range switch 120 is in Position 3, the test resistor 114 will be formed by just the three variable resistors 116a-116c.

As the exemplary embodiment 100 is illustrated, positions 1 and 4-6 of the range switch 120 will open the circuit, thus rendering the calibration device inoperative for calibration purposes. In alternative embodiments, however, at least some of those positions may also be used to provide different input resistance values to the sensing probe, thus providing for finer increments in resistance and allowing the accuracy and linearity of the probe response to be verified. For example, position 4 could be used to provide a resistance value that is 5% of the maximum resistance value expected to be encountered; position 5 could be used to provide a resistance value that is 50% of the maximum resistance value expected to be encountered; and position 6 could be used to provide a resistance value that is 100% of the maximum resistance value that is expected to be encountered. The specific manner in which additional resistors, to provide such additional resistance values, would be incorporated into the circuitry should be readily apparent to one of ordinary skill in the art in view of this disclosure.

As for the specific resistance values of the various resistors 116a-116d that are provided in the illustrated embodiment, they should be selected in view of resistivity values that are likely to be measured using sensing probes for which the calibration device of the invention has been designed. Thus, for example, sensing probes used to measure the purity of water will sense a maximum of approximately 18.18 MΩ (with variation attributable to water temperature). Accordingly, in the illustrated embodiment 100, variable-resistance resistor 116a has a maximum resistance of 50 kΩ; variable-resistance resistor 116b has a maximum resistance of 1 MΩ; and variable-resistance resistor 116c has a maximum resistance of 100 kΩ. Additionally, in the illustrated embodiment 100, the fixed-resistance offset resistor 116d is a 1 MΩ resistor. Therefore, when the range switch 120 is in Position 2, between 1 MΩ and 2.15 MΩ of resistance can be applied to the contacts of a sensing probe being calibrated. When the range switch 120 is in Position 3, on the other hand, between 0 and 1.5 MΩ of resistance can be applied to the contacts of a sensing probe being calibrated. By providing more offset resistors and corresponding circuit paths/active positions of range switch 120, even more resistivity-based sensing probes used to measure even more liquids besides water can be calibrated and verified using a calibration device as per the invention.

Figure 2:
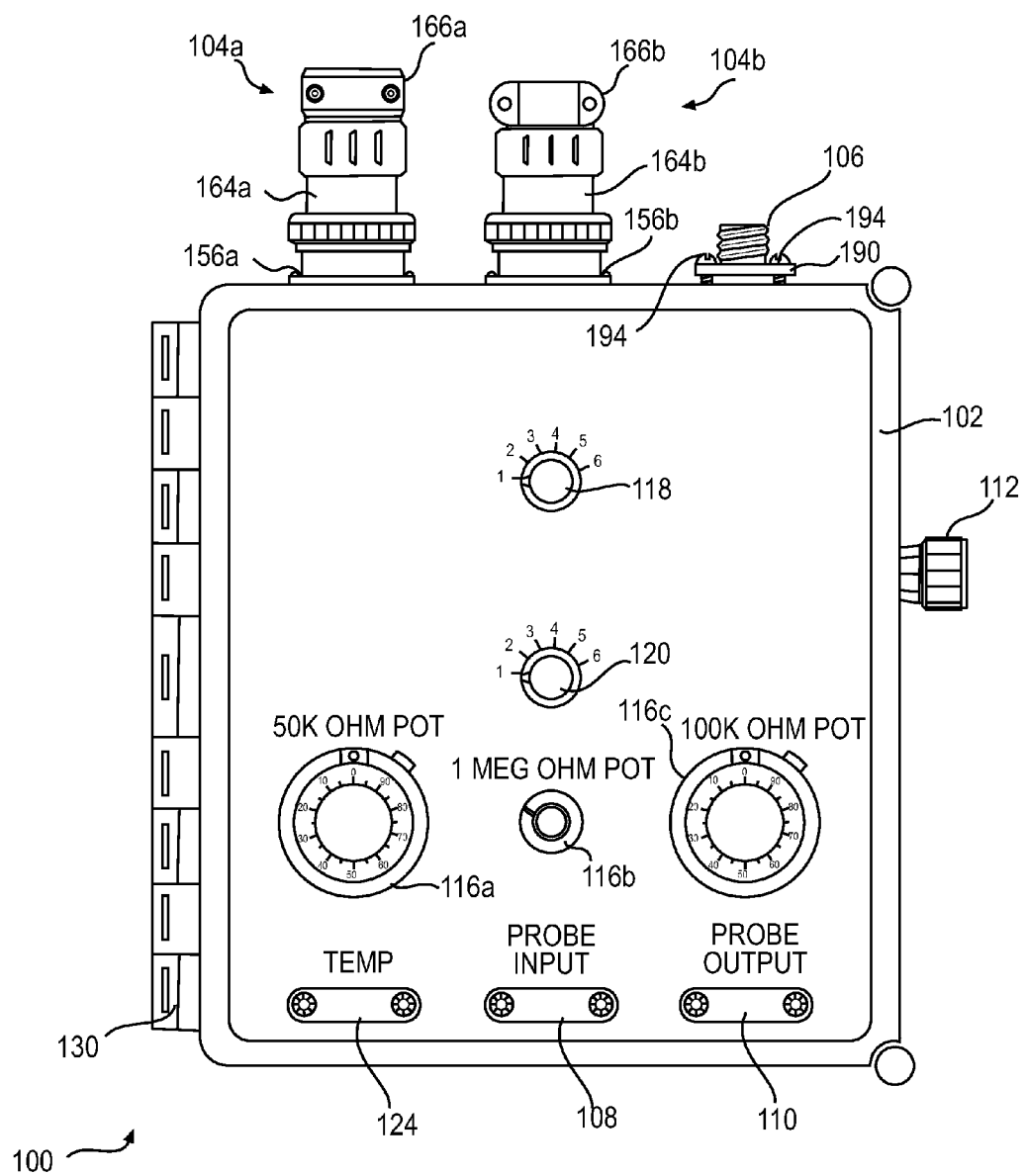
FIG. 2 is a front elevation view of a calibration device according to the invention.
Figure 3:
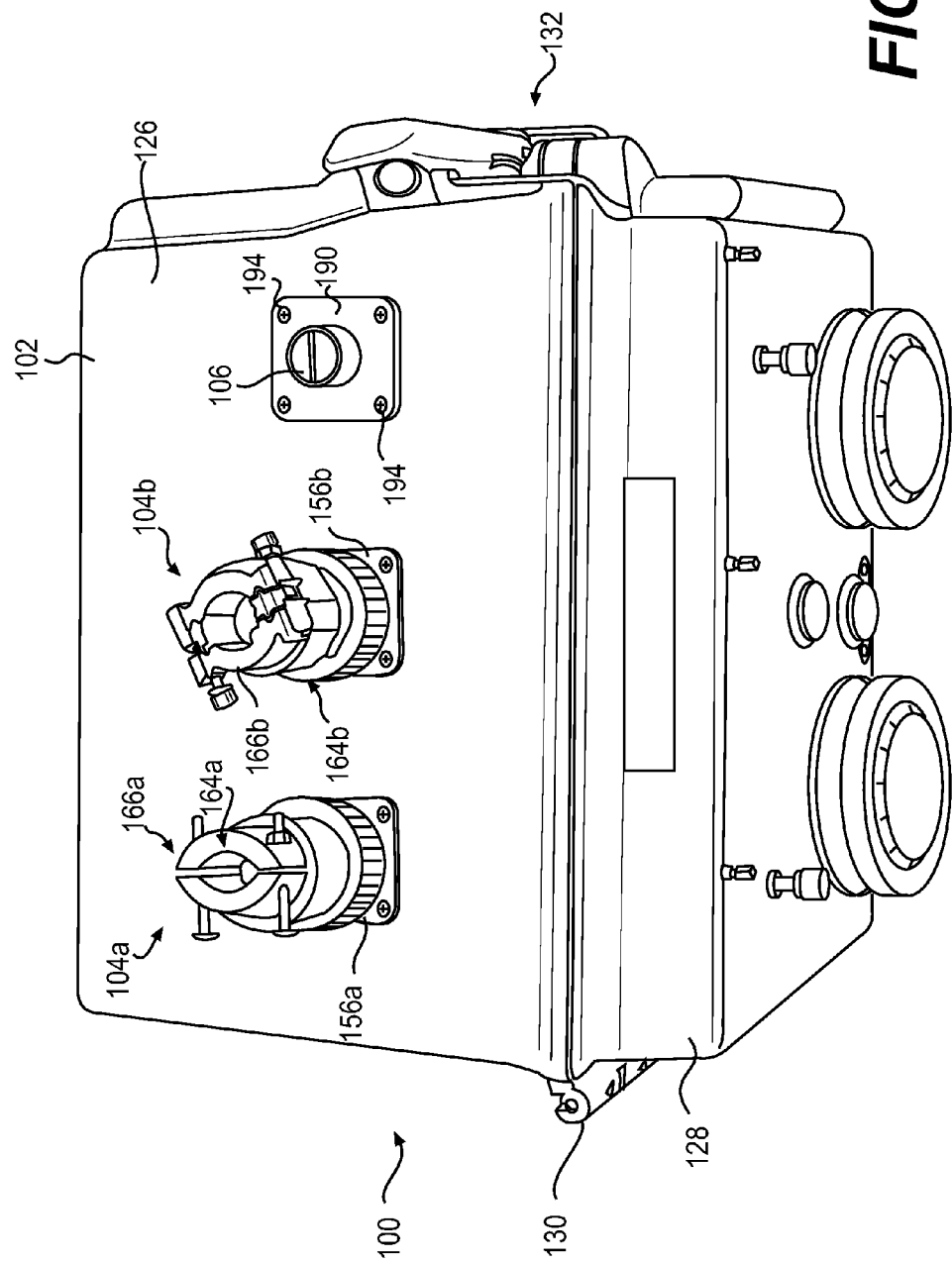
FIG. 3 is a top perspective view of the calibration device shown in FIG. 2.
Figure 4:
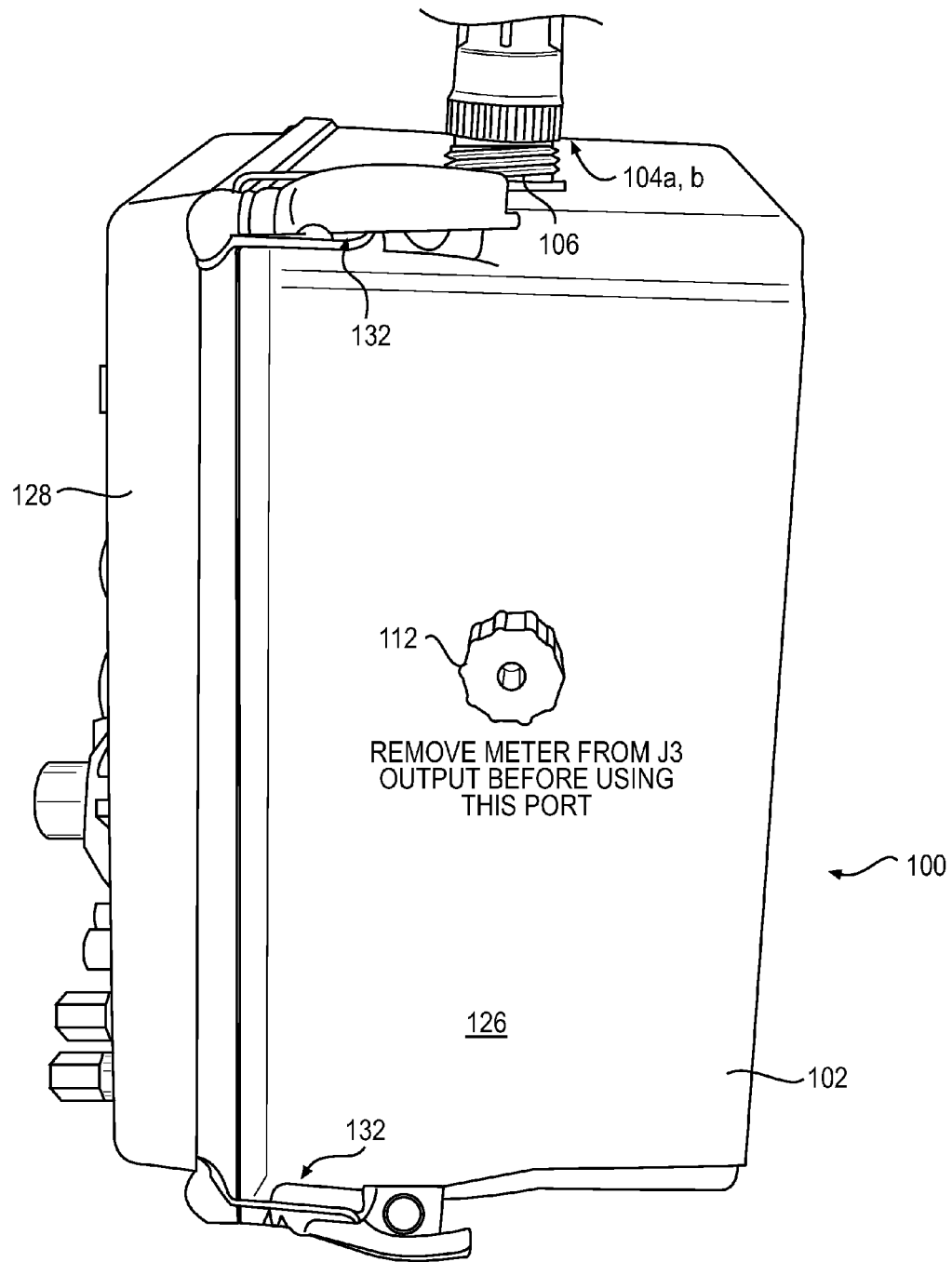
FIG. 4 is a side elevation view of the calibration device shown in FIG. 2.
Figure 5:
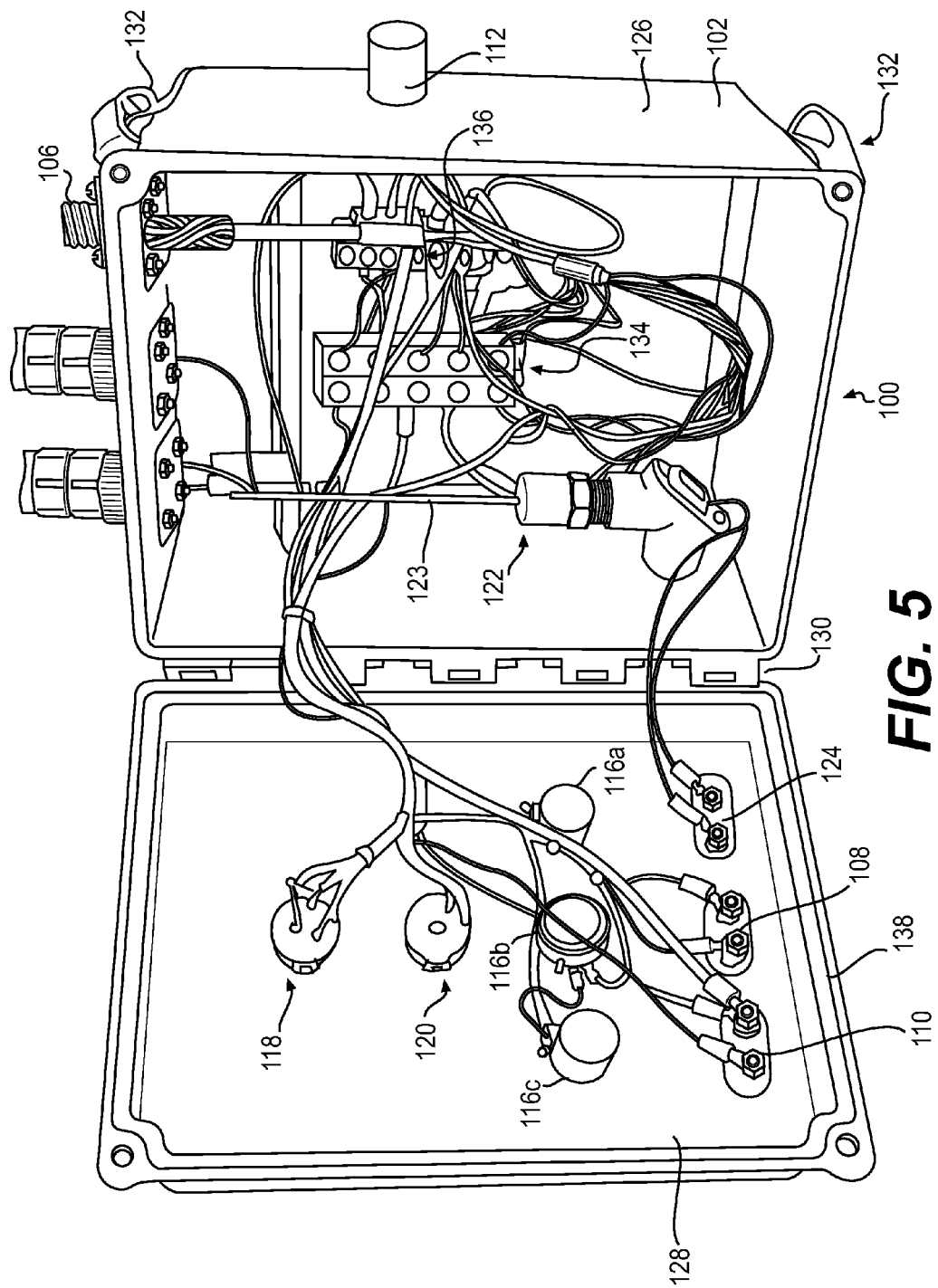
FIG. 5 is a side perspective view of the calibration device shown in FIG. 2, with the housing of the calibration device opened to expose internal components thereof.

As noted above, if a fixed-resistance test resistor were to be used, it would not be necessary for the calibration device to include a probe-input access point to permit the resistance being placed across the electrodes of the sensing probe to be measured directly. However, as explained above, the embodiment 100 of a calibration device according to the invention has variable resistors 116a-116c and, accordingly, a variable-resistance test resistor 114. In this regard, even though potentiometers frequently have markings to provide approximate indications of the resistance to which they are set as illustrated in FIG. 2, it is important to know the actual resistance of the test resistor 114 accurately in order to obtain correct results with a calibration device per the invention and to use it properly. Therefore, toward that end, the embodiment 100 includes probe-input access point 108.

Figure 6:
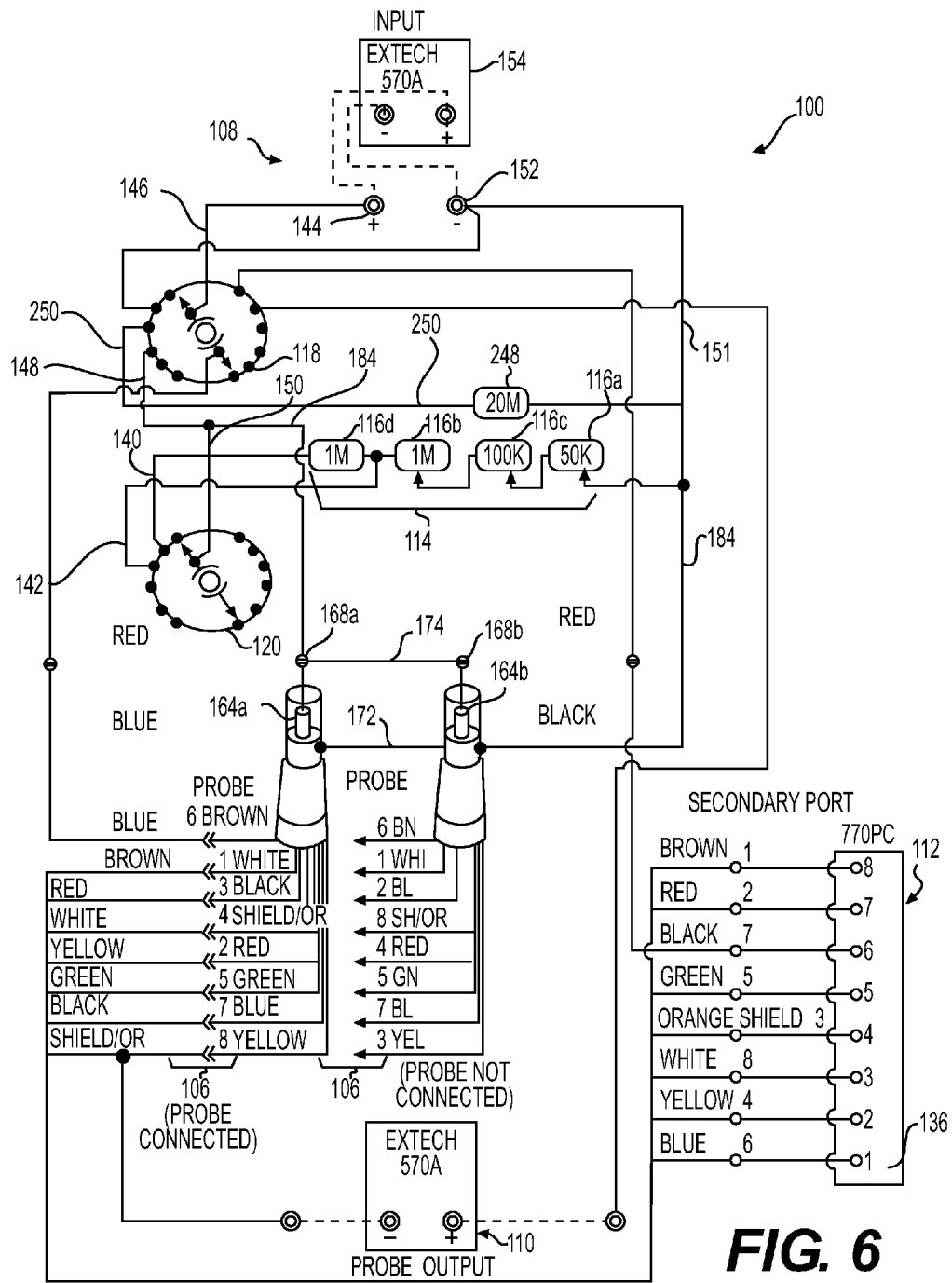
FIG. 6 is a circuit diagram of the calibration device shown in FIG. 2.
Figure 7:
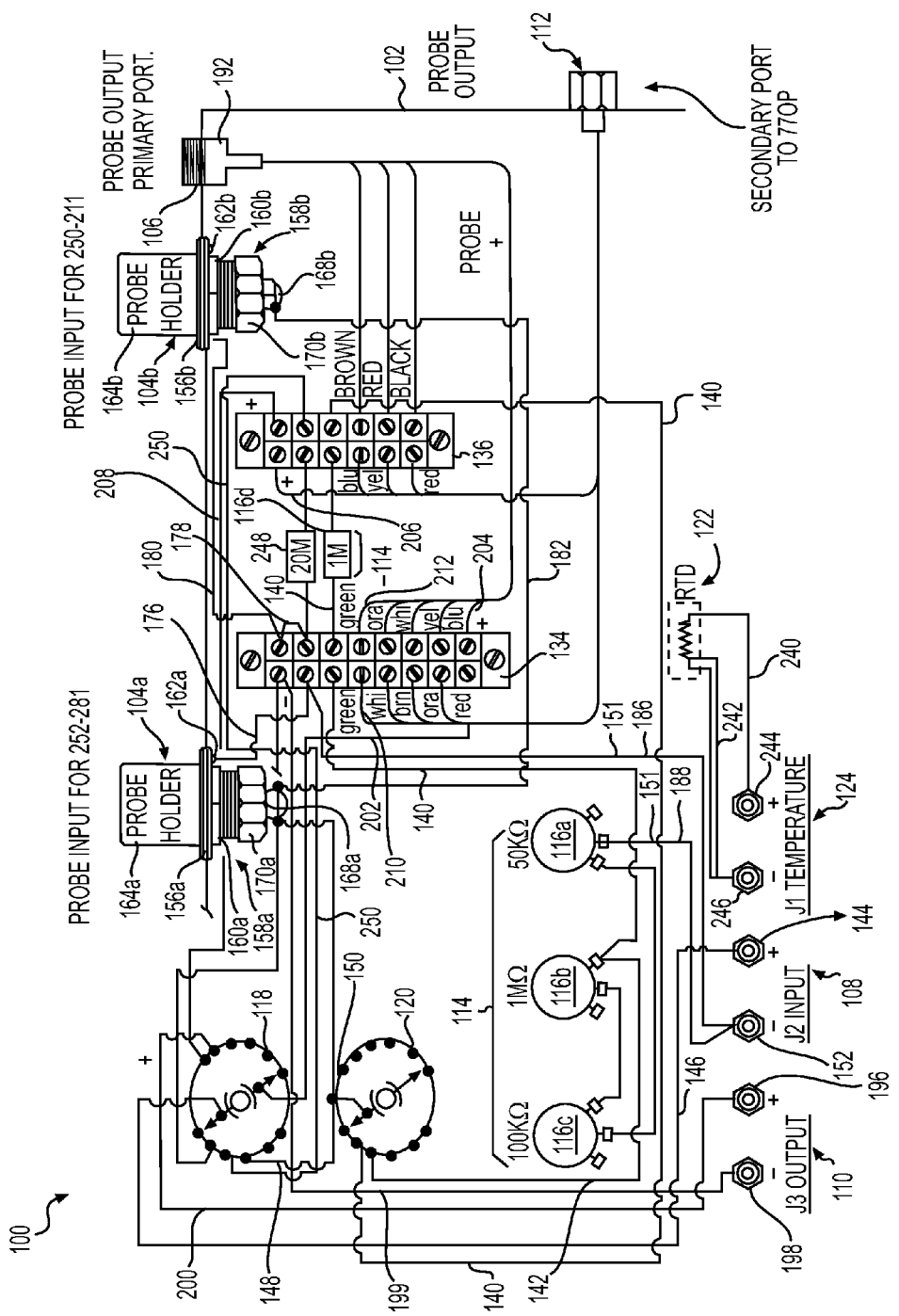
FIG. 7 is a wiring diagram of the calibration device shown in FIG. 2.
Figure 8:
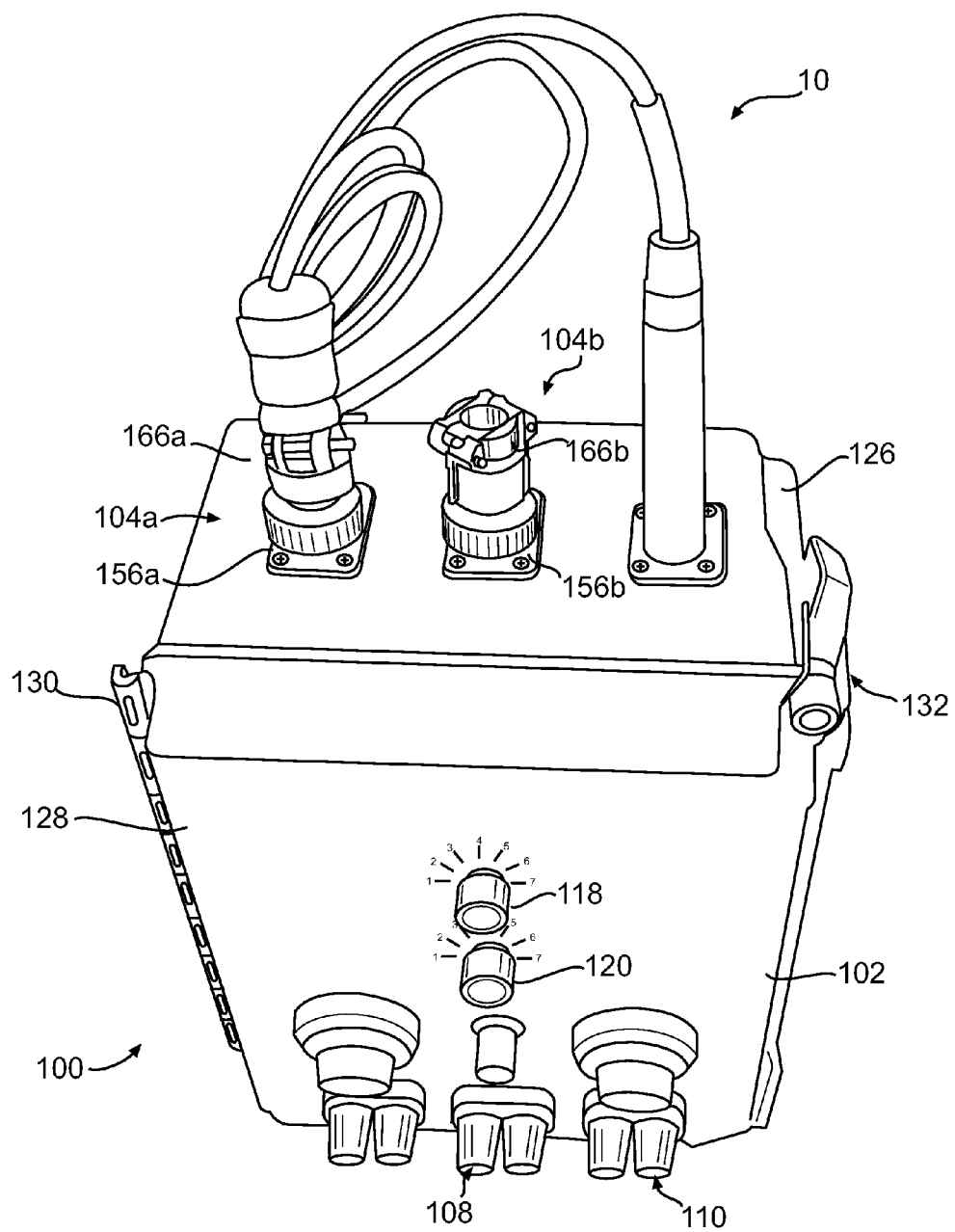
FIG. 8 is a top perspective view of the calibration device shown in FIG. 2 showing the device in use with a sensing probe.

Probe-input access point 108 is suitably provided by means of a two-contact electrical jack with which the positive and negative leads of an ohm meter can make contact. Furthermore, as illustrated in FIGS. 6 and 7, when function switch 118 is in Position 4, a circuit path will be formed as follows: extending from the positive contact 144 of the probe-input-access electrical jack; along conductor 146 and across function switch 118; along conductor segment 148 and conductor 150 and then across range switch 120; along conductor 140 or 142, depending on the setting of range switch 120; across the test resistor 114, with the offset resistor 116d being traversed or bypassed depending on the setting of range switch 120; along conductor segment 151; and ending at the negative contact 152 of the probe-input-access electrical jack. Thus, when function switch 118 is in Position 4, the probe-input access point 108 will be "active" and the actual resistance across the test resistor 114, as determined by the settings of the various resistors 116a-116c, can be determined by connecting an ohm meter (e.g., a MULTIMASTER high-accuracy multimeter 154 available from Extech Instruments based in Waltham, Mass.) FIG. 6) to the positive and negative contacts 144, 152 of probe-input access point 108.

As further indicated above, a calibration device according to the invention places the resistance of a test resistor across the electrodes of a resistivity/conductivity-based sensing probe, and the probe holder (or, as illustrated, probe holders) of a calibration device as per the invention facilitate(s) doing so. As illustrated in FIGS. 2, 3, 7, and 8, the probe holders 104a, 104b may suitably be provided using commonly available electrical couplings, with insulating material between the positive and negative contacts of the probe holders to prevent short-circuiting. As best shown in FIG. 7, the probe holders 104a, 104b are generally cylindrical and extend through holes in the upper wall of the housing 102 (i.e., one of the sidewalls of the container portion 126 of the housing PELICAN box), with external flanges 156a, 156b bearing against the outer surface of the upper wall of the housing 102 to limit penetration of the of the probe holders 104a, 104b into the interior of the housing 102. The lower portions 158a, 158b of the probe holders 104a, 104b—i.e., the portions that extend into the interior of the housing 102—are suitably externally threaded such that retaining nuts 160a, 160b can be screwed onto the lower portions 158a, 158b of the probe holders 104a, 104b to secure the probe holders 104a, 104b in position. Suitably, the retaining nuts 160a, 160b bear against retainers 162a, 162b (e.g., washers), which bear, in turn, against the interior surface of the upper wall of the housing 102. Additionally, a sealing gasket (not shown) may suitably be provided between each of the external flanges 156a, 156b and the external surface of the upper wall of the housing 102, between each of the retainers 162a, 162b and the internal surface of the upper wall of the housing 102, or between all of the flanges and the retainers and the external and internal surfaces of the upper wall of the housing 102, respectively, so as to seal the internal environment of the housing 102.

External to the housing 102, the probe holders 104a, 104b have generally cup-shaped, probe-receiving socket portions 164a, 164b. If the sensing heads of the probes in connection with which the calibration device is intended to be used are externally threaded (e.g., as illustrated in FIG. 1), then the socket portions 164a, 164b are suitably internally threaded to receive and securely hold the probe sensing heads by screwing the sensing heads into the socket portions 164a, 164b. On the other hand, if the sensing heads of the probes in connection with which the calibration device is intended to be used have smooth cylindrical outer surfaces, then the socket portions 164a, 164b suitably have smooth interior surfaces to afford a "slip fit" connection when the probe sensing heads are inserted into the socket portions 164a, 164b. In that case, it would be suitable for the socket portions 164a, 164b to have screw-tightened clamping members 166a, 166b to hold the sensing heads of the sensing probes securely in position when they are inserted into the socket portions 164a, 164b.

In general, as explained above, the sensing head of a sensing probe with which a calibration device per the invention is designed to work typically will have a cylindrical, outer shell electrode (e.g., shell electrode 18 of the SMART SENSOR sensing probe illustrated in FIG. 1). Therefore, the socket portions 164a, 164b of the probe holders 104a, 104b are suitably metallic so as to make electrical (i.e., current-conducting) contact with the outer shell electrode of a sensing probe that is inserted into either of the socket portions 164a, 164b of the probe holders 164a, 164b.

As further explained above, the sensing head of a sensing probe with which a calibration device per the invention is designed to work typically will also have a longitudinally extending central electrode, and each of the probe holders 104a, 104b suitably has a metallic, central contact member 168a, 168b, respectively, to make contact with the central electrode of the sensing probe sensing head. Suitably, the central contact members 168a, 168b each extend through the center of one of threaded caps 170a, 170b, respectively, which screw onto the externally threaded lower portions 158a, 158b of the probe holders 104a, 104b, respectively. Furthermore, the threaded caps 170a, 170b are most suitably made from non-electrically conducting material such as nylon to isolate/insulate the socket portions 164a, 164b of the probe holders 104a, 104b from the central contact members 168a, 168b, respectively.

As shown in FIGS. 6 and 7, relative to both the test resistor 114 and the contacts 144 and 152 of the probe-input access point 108, the probe holders 104a, 104b are arranged electrically in parallel to each other. Thus, as illustrated in FIG. 6, the socket portions 164a, 164b of the probe holders 104a, 104b—which make electrical contact with the outer, shell electrodes of the sensing probes—are "tied together" electrically via conductor 172. Similarly, the central contact members 168a, 168b—which make electrical contact with the center electrodes of the sensing probes—are "tied together" electrically via conductor 174. As illustrated in FIG. 7, conductor 172 is suitably comprised by wire 176, which connects the retainer 162a—and hence the socket portion 164a—of probe holder 104a to a first terminal (not labeled) of terminal strip 134; by a connection (not illustrated) between that first terminal and a second terminal (not labeled) that is across the terminal strip 134 from the first terminal; by jumper wire 178, which connects the second terminal to an immediately adjacent third terminal on the same side of the terminal strip 134; and by wire 180, which connects that third terminal to the retainer 162b—and hence the socket portion 164b—of probe holder 104b. On the other hand, conductor 174 is suitably comprised by a single wire 182 that directly connects the central contact members 168a, 168b to each other.

With this arrangement, as illustrated in FIG. 6, a circuit path traversing the test resistor 114 extends from the socket portion of either probe holder (which makes electrical contact with the shell electrode of a sensing probe sensing head inserted therein)—either directly from the socket portion 164b of probe holder 104b or "indirectly" from the socket portion 164a of probe holder 104a via conductor 172 (wires 176, 178, and 180) extending between the two socket portions; along conductor segment 184; across test resistor 114; along conductor 140 or 142, depending on the position of range switch 120, and across range switch 120; along conductor 150; along conductor segment 184; and terminating at the central contact member of either probe holder (which makes electrical contact with the central electrode of a sensing probe sensing head)—either directly at central contact member 168a of probe holder 104a or "indirectly" at central contact member 168b of probe holder 104b via conductor 174 extending between the two central contact members. Furthermore, as illustrated in FIG. 7, conductor segment 184 may be comprised by wire 176; wire 186, which is "tied" to wire 176 at the first terminal strip terminal referenced above; and wire 188, which constitutes conductor segment 151 and which is "tied" to wire 186 at the negative contact 152 of probe-input access point 108. Thus, in this manner, the test resistor 114 is applied across the positive and negative electrodes of a sensing probe sensing head that is inserted into either probe holder 104a or 104b.

In a simple implementation of the invention, in order to be able to read the resistance of the test resistor 114 as sensed by the sensing probe to evaluate the calibration/integrity of the sensing probe, the sensing probe's output connector (e.g., output connector 16 of the SMART SENSOR sensing probe 10 illustrated in FIG. 1) could be connected directly to a monitoring instrument (e.g., a 770PC multiparameter instrument/transmitter) that is configured to receive and process signals received from the sensing probe and to display the sensed parameter values. In that case, no probe-output port or probe-output access point would need to be provided at all.

To increase flexibility and ease of use of the instrument, however, the illustrated embodiment 100 of a calibration device per the invention includes probe-output port 106 and a primary probe-output access point 110. The primary probe-output access point 110 suitably provided by means of a two-contact electrical jack with which the positive and negative leads of an ohm meter can make contact. These two features allow the calibration device 100 to be used to check the calibration/integrity of a sensing probe without using a corresponding monitoring instrument, so long as an ohm meter is available to measure resistance across the positive and negative terminals 196, 198 of the primary probe-output access point 110.

Alternatively or additionally (as specifically illustrated in FIGS. 6 and 7), the illustrated embodiment 100 of a calibration device per the invention includes a secondary probe-output access point 112. The secondary probe-output access point 112 is configured to allow the calibration device 100 to be connected to a monitoring instrument (e.g., a 770PC multiparameter instrument/transmitter) using an appropriately configured connector (e.g., a multiple-conductor cable with appropriate fittings at each end) so that the sensing probe's output signals "pass through" the calibration device 100 to the monitoring instrument, where the sensing probe output can be read on the monitoring instrument's display.

As explained further below, function switch 118 is used to control whether the sensing probe's output can be measured or read via the primary probe-output access point 110 or the secondary probe-output access point 112. Although the sensing probe's output connector 16 could be connected directly to the monitoring instrument in a very simple implementation of the invention as noted above, providing both the first and second probe-output access points 110 and 112 and controlling which of the two is "active" by means of the function switch 118 lets an operator switch easily back and forth between the two probe-output access points, e.g., to cross-check operation of the monitoring instrument against the resistance value measured at the primary probe-output access point 110 using an ohm meter.

As illustrated in FIGS. 2, 3, 5, and 7, probe-output port 106 is provided on the top wall of the housing 102 (the same sidewall of the container portion 126 of the PELICAN box as on which the probe holders 104a, 104b are installed), generally adjacent to the probe holders 104a, 104b. The probe-output port 106 has the same configuration (i.e., geometry and pin/socket arrangement) as that found on a monitoring instrument with which sensing probes for which the calibration device is designed would be used, so that the output connector of a given sensing probe mates with the probe-output port 106 in the same manner as the output connector would mate with the connection point of a corresponding monitoring instrument.

Like the probes holders 104a, 104b, the probe-output port 106 extends through a hole in the top wall of the housing 102 and partially into the interior of the housing 102, with external flange 190 limiting the depth of penetration of body portion 192 (FIG. 7) into the interior of the housing 102. A backing plate (not illustrated) with threaded holes may be provided around the body portion 192; screws 194 are suitably provided, extending through the external flange 190 and the wall of the housing 102 and being used to draw the backing plate against the interior surface of the wall of the housing 102. A sealing gasket (not shown) may suitably be provided between the external flange 190 and the external surface of the wall of the housing 102; between the backing plate and the internal surface of the wall of the housing 102; or between both the external flange 190 and the backing plate and the external and internal surfaces of the wall of the housing 102, respectively, so as to seal the internal environment of the housing 102.

In general, a "simple" resistivity/conductivity-based sensing probe needs only two electrodes to operate—one being positive and the other being negative—and may have just two associated output conductors. More sophisticated sensing probes, on the other hand, may have more output conductors. For example, SMART SENSOR sensing probes have eight output conductors, which allow such sensors to be used to measure resistivity/conductivity; temperature; and various other process parameters, as well as to reprogram the EEPROM to change the cell constant. However, for the primary purpose of the present invention (placing a known or knowable resistance across the sensing probe and measuring the corresponding output of the sensing probe), just two of the sensing probe's output conductors are utilized, namely, the positive and negative output conductors.

Thus, when function switch 118 is in Position 5, the sensing probe's output (i.e., the resistance across the sensing probe's sensing head as measured by the sensing probe) can be measured at the first, primary probe-output access point 110. Toward that end, a conductive pathway will be established as follows: from the positive terminal 196 of the primary probe-output access point 110 along wire 200 to the Position 5 switch contact; across the function switch 118 via its wiper arm; along wire 202 to the terminal (unlabeled) at the lowermost position on the left side of terminal strip 134; across the terminal strip 134 to the opposite terminal (unlabeled); and from there along wire 204 to the positive contact point of the probe output port 106, which will be in electrical contact with the positive contact of the sensing probe's output connector 16. Additionally, another conductive pathway will be established as follows: from the negative terminal 198 of the primary probe-output access point 110 along wire 199 to the terminal (unlabeled) at the uppermost position on the left side of terminal strip 134; across the terminal strip 134 to the opposite terminal (unlabeled); and from there to the retainers 162a and 162b of the first and second probe holders 164a and 164b, respectively, via jumper wire 178/wire 176 (leading to the retainer 162a of the first probe holder 104a) and via wire 180 (leading to the retainer 162b of the second probe holder 104b), respectively. Because the retainers 162a and 162b are in electrical contact with the socket portions 164a and 164b of the probe holders 104a, 104b, respectively; because the socket portions 164a, 164b make electrical contact with the negative electrode of the sensing probe's sensing head 12 regardless of the probe holder 104a, 104b into which the sensing head 12 is inserted; and because the negative conductor in the sensing probe extends through the conductor cable 14 from the sensing head's negative electrode to the negative contact point of the sensing probe's output connector 16, the value of an electrical parameter (e.g., voltage or resistance relative to another circuit location) as measured at the negative terminal 198 of the primary probe-output access point 110 will be the same as the value of the electrical parameter as it would be measured at the negative contact of the sensing probe's output connector 16. In other words, connecting the sensing probe of an ohm meter to the negative terminal 198 of the primary probe-output access point 110 is equivalent to connecting the sensing probe of the ohm meter to the negative contact of the sensing probe's output connector 16.

On the other hand, when function switch 118 is in Position 6, the sensing probe's output (i.e., the resistance across the sensing probe's sensing head as measured by the sensing probe) can be measured at the secondary probe-output access point 112. Toward that end, a conductive pathway will be established as follows: from the positive pin or socket (not illustrated specifically) of the secondary probe-output access point 112; along wire 206 to the terminal (unlabeled) at the uppermost position on the left side of terminal strip 136; across the terminal strip 136 to the opposite terminal (unlabeled); along wire 208 to the Position 6 switch contact; across the function switch 118 via its wiper arm; along wire 202 to the terminal (unlabeled) at the lowermost position on the left side of terminal strip 134; across the terminal strip 134 to the opposite terminal (unlabeled); and from there along wire 204 to the positive contact point of the probe output port 106, which will be in electrical contact with the positive contact of the sensing probe's output connector 16. Additionally, another conductive pathway extends from the negative pin or socket (not illustrated specifically) of the secondary probe-output access point 112; along wire 210 to the uppermost terminal (unlabeled) on the left side of terminal strip 134; across the terminal strip 134 to the opposite terminal (unlabeled); and from there along wire 212 to the negative contact point of the sensing probe's output connector 16 and, hence, the negative contact of the sensing probe's output connector 16. Therefore, with this configuration, putting the function switch 118 into Position 6 will cause the sensing probe's output (i.e., the resistance placed across the sensing probe's sensing head 12, as measured by the sensing probe) to be displayed on a monitoring device that is connected to the calibration device 100 via the secondary probe-output access point 112 (assuming, of course, that the sensing probe's output connector 16 is connected to the probe output port 106).

(Signals on the other leads or contacts in the sensing probe's output connector 16—e.g., those used to measure temperature or other process parameters or those used to reset the sensing probe's cell constant—will pass, via the output port 106, directly to and across one or the other of the terminal strips 134 and 136 and, from there, to the monitoring instrument via the secondary probe-output access point 112.)

As noted above, SMART SENSOR sensing probes (as well as various other sensing probes) can measure temperature of a liquid into which they are placed. Therefore, by leaving the sensing head of a sensing probe being tested in one of the probe holders long enough for it to equilibrate in temperature with the interior of the housing 102, and by independently measuring the temperature inside of the housing 102 using the temperature sensor 122, it is possible to verify whether the temperature sensing components of the sensing probe are working properly. Additionally or alternatively, it would be particularly advantageous to measure temperature inside of the housing 102 if the test resistor has a generally fixed resistance value—particularly if the calibration device does not have an independent probe-input access point—so that fluctuation in the actual resistance of the test resistor attributable to variation in temperature inside of the housing 102 can be accounted for, as address briefly above.

Regarding temperature sensor 122, as noted above, it is suitably an RTD temperature sensor, and it may be mounted inside of the housing in any convenient manner. Furthermore, as illustrated in FIG. 6, a pair of conductors 240, 242 extend from terminals on the temperature sensor 122 to the positive and negative contacts 244, 246, respectively, of the fourth access point 124. (The temperature sensor and the fourth access point 124 are not shown in FIG. 6.) Suitably, the fourth access point 124 is a two-contact electrical jack with which the positive and negative leads of an ohm meter can make contact.

The embodiment 100 of a calibration device per the invention includes a check or "spanning" resistor 248. The check resistor 248, which can be fixed (as illustrated) or variable (not illustrated), permits a user to verify that the device being used to measure the actual resistance of the test resistor 114 is functioning and is able to measure the maximum possible value of the test resistor's resistance. Therefore, the check resistor has a known fixed or a known maximum resistance value, and that maximum resistance value of the check resistor is greater than or equal to the resistance or maximum resistance value of the test resistor 114 with generally the same order of magnitude thereof. Thus, in the embodiment 100 of a calibration device per the invention, the maximum resistance of the test resistor 114 is 2.15 MΩ; accordingly, the check resistor 248 has a resistance of 20 MΩ.

To measure resistance across the check resistor 248, the function switch 118 is moved to Position 3. With the function switch 118 in that position, a circuit path will be formed extending from the positive contact 144 of the electrical jack probe-input access point 108; along conductor 250 and across the check resistor 248; along conductor segment 151; and ending at the negative contact 152 of the probe-input-access electrical jack. As shown in FIG. 7, the check resistor 248 suitably extends from one terminal of terminal strip 134 (viz., the second unlabeled terminal referenced above) to a second terminal on the other terminal strip 136; conductor 250 extends from the #3 contact on the function switch 118 to a further, third terminal on the terminal strip 136 that is across from the second terminal; and conductor segment 151 is constituted by wire 186 (instead of by wire 188 as is the case when the function switch 118 is in Position 4). Thus, the probe-input access point 108 will be "active" when function switch 118 is in Position 3, but instead of resistance across the test resistor 114, resistance across the check resistor 248 will be measurable at the probe-input access point 108, and the ability (i.e., ohm range) of the device being used to measure the test resistor's resistance can be verified.

From the foregoing description of a calibration device according to the invention, how it is used to calibrate/verify the integrity of a sensing probe should be fairly apparent. Thus, according to an embodiment of a corresponding methodological aspect of the invention, the sensing head of a sensing probe is inserted into a probe holder, and a known (e.g., a fixed, predetermined) or a knowable (e.g., a variable, user-measurable) test resistance is placed across the sensing electrodes of the sensing probe. If the test resistance is provided by a variable resistor, then the test resistance is measured; if the test resistance is provided by a fixed resistor, the test resistance may still be measured to avoid errors due to temperature-based fluctuation in resistance. (The resistance of a fixed-resistance resistor can be measured directly, or it can be deduced by measuring temperature inside the calibration device and modifying the previously known, fixed value to compensate for temperature-based fluctuation in resistance.) An output of the sensing probe—viz., the resistance as measured by the sensing probe—is obtained and compared to the actual test resistance. If the measured and the actual test resistance are the same, the sensing probe is "good" and nothing needs to be done. If the measured and the actual test resistance vary by an amount that is within manufacturer (or other) allowable amounts, the sensing probe's cell constant will need to be recalculated. Depending on the type of sensing probe, it may be possible to store the recalculated cell constant in the sensing probe's memory. And if the measured and the actual test resistance vary by an amount that exceeds the allowable amount, the sensing probe is deemed to be defective and is discarded.

If it needs to be measured, the actual test resistance is measured by, for example, connecting an ohm meter to a probe-input access point on the calibration device. Depending on the configuration of the calibration device and/or where it is being used, the test resistance as measured by the sensing probe—i.e., the probe output—can be measured by plugging an output end of the sensing probe into a monitoring device with which the sensing probe ordinarily is used. Alternatively, the output end of the sensing probe can be plugged into a probe-output port on the calibration device and the output resistance can be measured by, for example, connecting an ohm meter to a probe-output access point on the calibration device.

It will be apparent that various modifications to and departures from the above-described methodologies will occur to those having skill in the art. What is desired to be protected by Letters Patent is set forth in the following claims.

I claim:

1. A calibration device for use in checking the integrity and/or calibration of a resistivity-based sensing probe, the sensing probe having a pair of electrodes across which the conductivity/resistivity of a liquid medium is measured when the probe is in operational use and an output connector at an output portion thereof by means of which the sensing probe can be connected to a monitoring instrument that is used to monitor one or more parameters sensed by the sensing probe, the calibration device comprising:
    a housing;
    a test resistor disposed within the housing, the test resistor having a known, predetermined resistance value or a variable resistance value that can be measured while the test resistor is enclosed within the housing;
    a first probe holder configured to hold the sensing probe so as to bring the sensing probe's electrodes into electrical contact with the test resistor so that the test resistor provides a known or a knowable test resistance between the sensing probe's electrodes;
    a first probe-output port by means of which the sensing probe's output connector can be connected to the calibration device; and
    a probe-output access point at which resistance across the test resistor, as measured by the sensing probe and output from the sensing probe via the output connector, can be measured using an ohmmeter.

2. The calibration device of claim 1, wherein the test resistor comprises one or more variable-resistance devices and the calibration device has a probe-input access point at which resistance across the test resistor can be measured.

3. The calibration device of claim 2, further comprising:
    a function switch for selectively controlling whether the test resistor is in electrical contact with the probe-input access point.

4. The calibration device of claim 2, wherein the test resistor further comprises one or more fixed-resistance, offset resistance devices that are placed electrically in series with the variable-resistance-value device(s).

5. The calibration device of claim 4,
    wherein the fixed-resistance, offset resistance device(s) are placed electrically in series with the variable-resistance-value device(s), and
    wherein the calibration device further comprises a range switch by means of which the fixed-resistance-value device(s) is/are placed into or taken out of series with the variable-resistance-value device(s).

6. The calibration device of claim 1, wherein the test resistor has a fixed resistance value.

7. The calibration device of claim 1, wherein the probe-output access point is configured to permit measurement of resistance across the test resistor, as measured by the sensing probe and output from the sensing probe via the output connector, using an ohm meter.

8. The calibration device of claim 7,
    wherein the probe-output access point is in electrical contact with the probe-output port; and
    wherein the calibration device further comprises a function switch which controls whether the probe-output port is in electrical contact with the probe-output access point.

9. The calibration device of claim 1, wherein the probe-output access point is configured to permit the calibration device to be connected to the monitoring instrument in signal-conducting relationship therewith, whereby resistance across the test resistor, as measured by the sensing probe and output from the sensing probe via the output connector, can be detected by the monitoring instrument.

10. The calibration device of claim 9,
    wherein the probe-output access point is in electrical contact with the probe output port; and
    wherein the calibration device further comprises a function switch which controls whether the probe-output port is in electrical contact with the probe-output access point.

11. The calibration device of claim 9, wherein the sensing probe is a smart probe with a cell constant value stored therein, the calibration device further comprising sufficient conductors arranged to permit the cell constant value to be changed using the monitoring instrument when the calibration device is connected to the monitoring instrument and the sensing probe's output connector is connected to the probe-output port.

12. The calibration device of claim 1, further comprising:
    a second probe-output access point that is configured to permit the calibration device to be connected to the monitoring instrument in signal-conducting relationship therewith, whereby resistance across the test resistor, as measured by the sensing probe and output from the sensing probe via the output connector, can be detected by the monitoring instrument.

13. The calibration device of claim 12,
wherein the first probe-output access point and the second probe-output access point are placed in electrical contact with the probe-output port; and
wherein the calibration device further comprises a function switch which controls whether the probe-output port is in electrical contact with the first or the second probe-output access point.

14. The calibration device of claim 1, further comprising:
a second probe holder attached to the housing and by means of which the sensing probe's electrodes can be brought into electrical contact with the test resistor so that the test resistor provides a known or a knowable test resistance between the sensing probe's electrodes, wherein the second probe holder is configured to hold a sensing probe of a different size than the first probe holder is configured to hold.

15. The calibration device of claim 1, further comprising a temperature sensor disposed within the housing to permit measurement of ambient temperature inside the housing.

16. A calibration device for use in checking the integrity and/or calibration of a resistivity-based sensing probe, the sensing probe having a pair of electrodes across which the conductivity/resistivity of a liquid medium is measured when the probe is in operational use, the calibration device comprising:
a housing;
a test resistor disposed within the housing, the test resistor having a known, predetermined resistance value or a variable resistance value that can be measured while the test resistor is enclosed within the housing;
a first probe holder configured to hold the sensing probe so as to bring the sensing probe's electrodes into electrical contact with the test resistor so that the test resistor provides a known or a knowable test resistance between the sensing probe's electrodes;
a check resistor with a known fixed or a known maximum resistance value, the known fixed or maximum resistance value of the check resistor being greater than or equal to the resistance or maximum resistance value of the test resistor and having the same order of magnitude thereof; and
an access point at which resistance across the check resistor can be measured using a measuring device;
whereby the ability of the measuring device to measure the resistance or maximum resistance of the check resistor, and hence of the test resistor, can be verified.

17. The calibration device of claim 16,
wherein the test resistor and the check resistor can alternately be brought into electrical contact with the access point, and
wherein the calibration device further comprises a function switch which controls whether the test resistor or the check resistor is in electrical contact with the access point.

* * * * *